(12) United States Patent
Cheng et al.

(10) Patent No.: US 12,126,103 B2
(45) Date of Patent: Oct. 22, 2024

(54) COAXIAL TRANSMISSION LINE SLI SOCKET DESIGNS FOR 224GBS AND BEYOND

(71) Applicant: Intel Corporation, Santa Clara, CA (US)

(72) Inventors: Feifei Cheng, Chandler, AZ (US); Zhe Chen, Chandler, AZ (US); Ahmet C. Durgun, Chandler, AZ (US); Zhichao Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 752 days.

(21) Appl. No.: 17/131,686

(22) Filed: Dec. 22, 2020

(65) Prior Publication Data
US 2022/0200178 A1    Jun. 23, 2022

(51) Int. Cl.
*H01R 12/71* (2011.01)
*H01R 12/70* (2011.01)
(Continued)

(52) U.S. Cl.
CPC ....... *H01R 12/714* (2013.01); *H01R 12/7076* (2013.01); *H01R 13/2407* (2013.01);
(Continued)

(58) Field of Classification Search
CPC .. H01R 12/712; H01R 12/714; H01R 12/716; H01R 12/718; H01R 12/7076; H01R 13/2407; H01R 13/6585; H01R 13/6594; H01R 13/6597; H01R 13/2471; H01R 33/76; H01R 33/7607
(Continued)

(56) References Cited

U.S. PATENT DOCUMENTS

2013/0065455 A1    3/2013   Kawata
2022/0200178 A1*   6/2022   Cheng ................ H01R 13/2407

FOREIGN PATENT DOCUMENTS

KR       102163379       10/2020
WO     WO 2012/122142     9/2012
WO     WO 2014/017402     1/2014

OTHER PUBLICATIONS

Search Report from European Patent Application No. 21198865.4, mailed Mar. 14, 2022, 24 pgs.
(Continued)

*Primary Examiner* — Khiem M Nguyen
(74) *Attorney, Agent, or Firm* — Schwabe, Williamson & Wyatt P.C.

(57) ABSTRACT

In an embodiment, a socket comprises a housing, where the housing is a dielectric material. In an embodiment, a shell passes through a thickness of the, where the shell is conductive. The socket may further comprise a plug within the shell, where the plug is a dielectric material, and where the plug has a bottom surface. In an embodiment, a pin passes through the thickness of the housing within an inner diameter of the shell, where the pin has a first portion with a first diameter and a second portion with a second diameter, and where the pin is conductive. In an embodiment, the socket further comprises a spring around the first portion of the pin, where a first end of the spring presses against the bottom surface, and where a second end of the spring presses against the second portion of the pin.

25 Claims, 9 Drawing Sheets

(51) Int. Cl.
  *H01R 13/24*      (2006.01)
  *H01R 13/6585*    (2011.01)
  *H01R 13/6594*    (2011.01)
  *H01R 13/6597*    (2011.01)
  *H01R 33/76*      (2006.01)

(52) U.S. Cl.
  CPC ..... *H01R 13/6585* (2013.01); *H01R 13/6594* (2013.01); *H01R 13/6597* (2013.01); *H01R 33/76* (2013.01); *H01R 13/2471* (2013.01)

(58) Field of Classification Search
  USPC .......................................................... 439/66
  See application file for complete search history.

(56) References Cited

OTHER PUBLICATIONS

Office Action from European Patent Application No. 21198865.4, mailed Mar. 27, 2024, 9 pgs.

\* cited by examiner

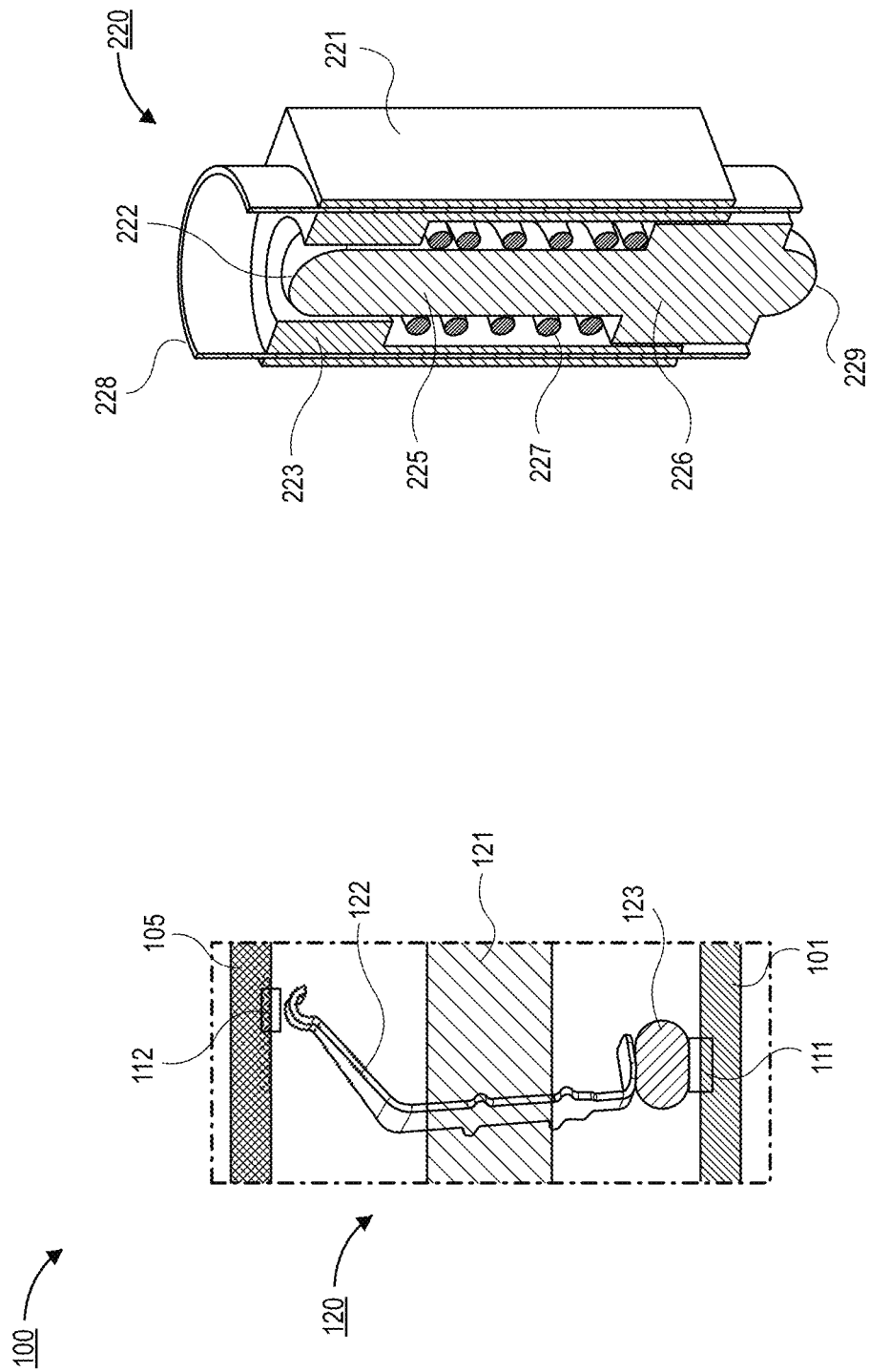

COAXIAL TRANSMISSION LINE SLI SOCKET DESIGNS FOR 224GBS AND BEYOND

TECHNICAL FIELD

Embodiments of the present disclosure relate to electronic packages, and more particularly to sockets with spring engaged contacts and a coaxial architecture.

BACKGROUND

Higher data transfer rates between multi-core processors, peripheral components and memories are in demand to keep up with the computing needs and core counts of high-performance server and client processors. To sustain the data exchange rate, diligent efforts have been made to improve the performance of the passive channels. Specifically, for root complex packages, enabling low loss substrates, reducing metal surface roughness, optimizing package routing, and enabling of a high-performance second level interconnect (SLI) sockets are all extremely critical.

As the interconnect interface between the package and the motherboard, the SLI socket significantly impacts the performance of the entire passive channel. The current widely used land grid array (LGA)/ball grid array (BGA) socket contact design limits performance by introducing impedance discontinuities and excessive crosstalk. Moreover, LGA/BGA sockets encounter scalability difficulties because of the potentially impractical loading force with the pin-count growing.

One solution for improving socket design is with so called compression mounting technology (CMT) sockets. In a CMT socket, the solder ball is removed and results in mechanical load reduction benefit and some impedance discontinuities being avoided. However, pin count increases driven by rapidly rising IO demand is still inevitable because of the need to maintain certain signal pin to ground pin ratio. As a result, CMT architectures can only alleviate, but not completely avoid, scalability problems.

In order to address cross-talk, some shielded socket architectures have been proposed. In such architectures, a conductive shield is provided along the surfaces of the socket housing surrounding the pin. However, significant portions of the pins extend past the top and bottom of the socket housing, and therefore are unshielded. As such, the shielding effectiveness is limited.

BRIEF DESCRIPTION OF THE DRAWINGS

FIG. 1 is an illustration of an LGA/BGA socket.

FIG. 2 is a sectional illustration of a socket with a coaxial architecture, in accordance with an embodiment.

EMBODIMENTS OF THE PRESENT DISCLOSURE

Figure 3:
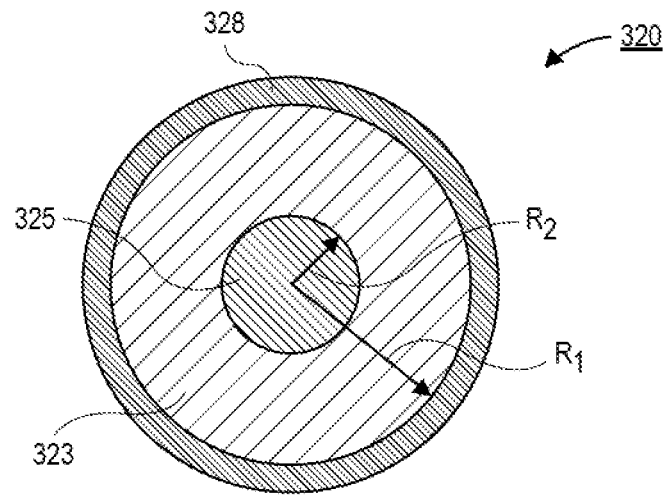
FIG. 3 is a cross-sectional illustration of a socket pin surrounded by a conductive shell, in accordance with an embodiment.

Described herein are sockets with spring engaged contacts and a coaxial architecture, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

To provide context for embodiments disclosed herein, a typical LGA/BGA socket architecture is shown in FIG. 1. In FIG. 1, the electronic package 100 comprises a board 101 with a first pad 111 and a package substrate 105 with a second pad 112. In an embodiment, a socket 120 provides the interconnection between the first pad 111 and the second pad 112. The socket comprises a socket housing 121 with a socket pin 122 passing through the socket housing 121. A first end of the socket pin 122 is a BGA pad that is coupled to the first pad 111 by a solder ball 123. A second end of the socket pin 122 is an LGA pad that contacts the second pad 112.

Such a socket architecture has significant drawbacks, as noted above. Particularly, the presence of the slender cantilever beam and the solder ball 123 provides a significant impedance discontinuity. Additionally, since there is no shielding of the socket pin 122 there is significant cross-talk concerns. In order to minimize cross-talk, many grounded pins are needed between signaling pins. This provides design challenges, especially as the drive towards increased IO density is growing.

Accordingly, embodiments disclosed herein include socket architectures that provide for reductions in impedance discontinuities and reduced cross-talk. The impedance discontinuity is improved by removing the solder ball, as well as tuning the impedance of the pin through design optimizations of the dimensions and materials of the socket, e.g. changing from a cantilever beam design to a pogo pin design with optimized OD. Additionally, cross-talk reduction is provided by a conductive shield surrounding the pin. In some embodiments, the conductive shield is directly connected to package and board ground planes for return path optimization. As illustrated in the graphs described below, the electrical performance of socket embodiments disclosed herein are significantly improved. Such improvements enable electronic packages to reach 224 Gb/s and higher data transfer rates. Embodiments disclosed herein also allow for significant socket scalability. Due to the cross-talk reductions attributable to the improved shielding, ground pins can be reduced or eliminated. Therefore, an overall pin count reduction between approximately 30% and approximately 50% can be achieved, compared to existing solutions.

Referring now to FIG. 2, a sectional illustration of a socket 220 is shown, in accordance with an embodiment. In an embodiment, the socket 220 comprises a dielectric housing 221. In an embodiment, a conductive shell 228 passes through the dielectric housing 221. The conductive shell 228 may have a height that is greater than a thickness of the dielectric housing 221. As such, ends of the pin that extend out past the dielectric housing 221 remain shielded by the conductive shell 228. The conductive shell 228 are grounded, as will be described in greater detail below.

In an embodiment, a conductive pin is provided within the conductive shell 228. The pin may comprise a first portion 225 and a second portion 226. The first portion 225 may have a first diameter and the second portion 226 may have a second diameter that is greater than the first diameter. The first portion 225 passes through a plug 223 that is present within the conductive shell 228. In an embodiment, the plug 223 is a dielectric material. A first end 222 of the pin may be configured to extend out a top side of the dielectric housing 221 to engage with LGA pad on the CPU package. In an embodiment, a spring 227 may be provided around the first portion 225 of the pin. A top end of the spring 227 may contact the plug 223, and a bottom surface of the spring 227 may press against the second portion 226 of the pin. Since the dielectric housing 221 is secured to an underlying board (not shown), the spring 227 provides a force that pushes against the second portion 226 to engage a second end 229 with an underlying pad on the board.

Referring now to FIG. 3, a cross-sectional illustration of a portion of the socket 320 through the first portion 325 of the pin and the plug 323 is shown, in accordance with an embodiment. In an embodiment, the dimensions of the inner radius $R_1$ of the shell 328, the radius $R_2$ of the first portion 325 and the dielectric constant Er of the plug material may be selected to provide a desired impedance in order to minimize impedance discontinuities. The impedance Z is provided by Equation 1. As those skilled in the art will appreciate, the package and board pads are typically larger than the radius of the pin and the package and board vias. As such a capacitive discontinuity may be generated. To compensate for this discontinuity, the characteristic impedance of the coaxial pin may be designed slightly larger than the desired value.

$$Z = \frac{60 \ln\left(\frac{R_1}{R_2}\right)}{\sqrt{\epsilon_r}} \quad \text{Equation 1}$$

Figure 4:
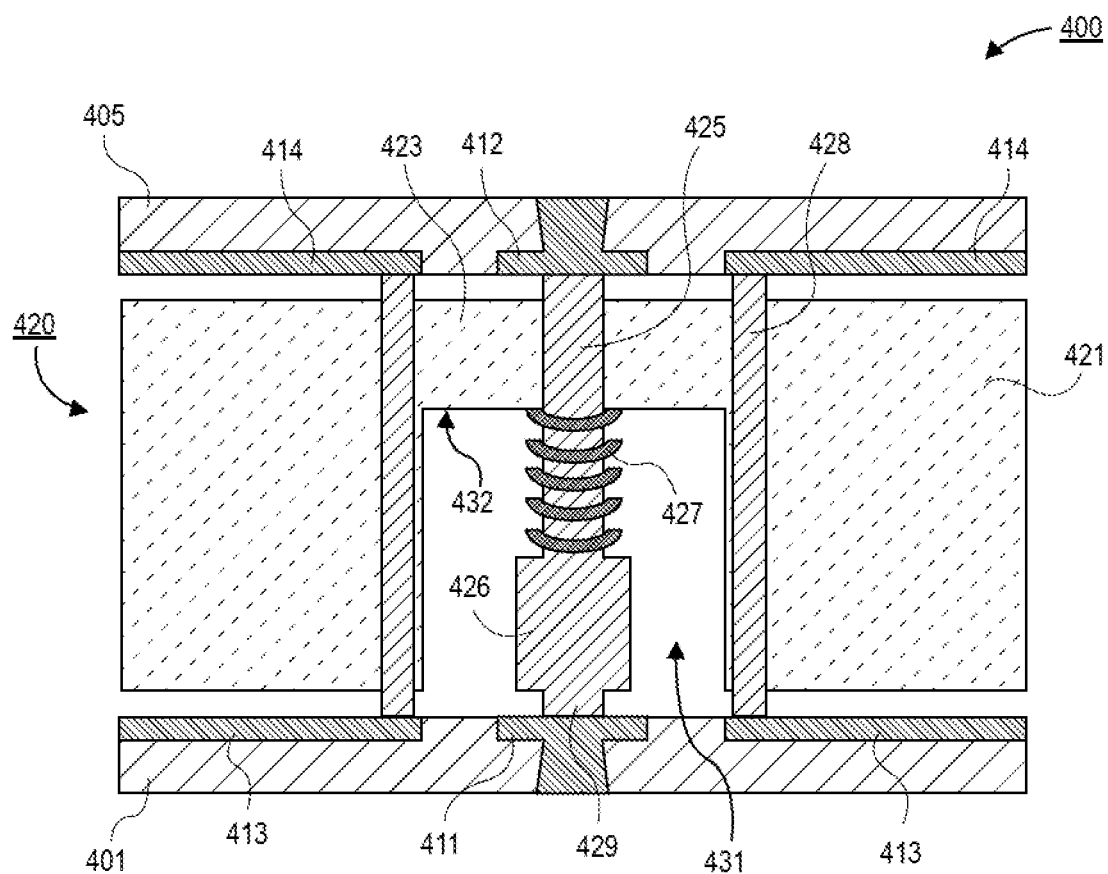
FIG. 4 is a cross-sectional illustration of an electronic package with a socket with a coaxial architecture, where a spring forces the pin of the socket against a pad on a board, in accordance with an embodiment.

Referring now to FIG. 4, a cross-sectional illustration of an electronic package 400 is shown, in accordance with an embodiment. In an embodiment, the electronic package 400 comprises a board 401, such as a printed circuit board (PCB). The electronic package 400 further comprises a package substrate 405. The package substrate 405 is coupled to the board 401 by a socket 420. In an embodiment, the board 401 comprises a first signal pad 411 and a ground plane 413. The package substrate 405 comprises a second signal pad 412 and a ground plane 414.

In an embodiment, the socket 420 comprises a socket housing 421. The socket housing 421 may comprise a dielectric material, such as a plastic. In an embodiment, a through hole 431 is provided through the socket housing 421. The through hole 431 passes entirely through a thickness of the socket housing 421. In an embodiment, a conductive shell 428 is provided within the through hole 431 of the socket housing 421. The conductive shell 428 may be any conductive material, such as copper or the like. In an embodiment, the conductive shell 428 may be insert molded or stitched into the socket housing 421. In an embodiment, the conductive shell 428 passes past a top surface and a bottom surface of the socket housing 421. That is, a height of the conductive shell 428 is greater than a thickness of the socket housing 421. Providing a conductive shell 428 that extends past the top and bottom surfaces of the socket housing 421 has several benefits. One benefit is that the entire length of the signaling pin can be shielded, and cross-talk is reduced. Additionally, the conductive shell 428 can function as an interstitial seating plane (ISP) to act as a hard stop for the package substrate 405 and the board 401 during assembly. In an embodiment, the conductive shell 428 is grounded. Particularly, the conductive shell 428 may be electrically coupled to the ground plane 413 on the board 401 and the ground plane 414 on the package substrate 405.

In an embodiment, a plug 423 is provided within the conductive shell 428. The plug 423 may be a dielectric material that is tuned to help provide a desired impedance. In an embodiment, the plug 423 is provided proximate to a top side of the conductive shell 428. That is, the plug 423 may be closer to the package substrate 405 than to the board 401. The plug 423 may be secured to an interior surface of the conductive shell 428. In the illustrated embodiment, a thin portion of the plug 423 extends down the interior surface of the conductive shell 428. However, it is to be appreciated that the plug 423 may also omit such extensions in some embodiments. In an embodiment, the plug 423 may comprise a bottom surface 432. The bottom surface 432 serves as a stop for a spring 427.

In an embodiment, a conductive pin passes through an interior of the conductive shell 428. The pin may comprise a plurality of portions of varying diameters. In an embodiment, a first portion 425 has a first diameter and a second portion 426 has a second diameter. The second diameter may be larger than the first diameter. In an embodiment, the larger second diameter may provide a stop for the spring 427. That is, the spring 427 may be secured between the plug 423 and the second portion 426 of the pin. In an embodiment, the pin may further comprise a third portion 429. The third portion 429 of the pin may be positioned between the second portion 426 and the board 401. The third portion 429 of the pin may contact the first pad 411. In an embodiment, the first portion 425 of the pin may contact the second pad 412 on the package substrate 405.

In an embodiment, the first portion 425 of the pin may pass through the plug 423. In an embodiment, a hole through the plug 423 allows for the first portion 425 of the pin to displace relative to the plug 423. That is, the plug 423 and the first portion 425 of the pin are not affixed to each other, and the first portion 425 of the pin can slide up and down within the plug 423.

In an embodiment, the spring 427 is a helical spring. The spring 427 may surround the first portion 425 of the pin. In an embodiment, the plug 423 is affixed to the conductive shell 428, and causes the spring 427 to provide a downward force on the second portion 426 of the pin. The downward force and responding spring stroke length allows for the socket 420 to provide good electrical connections at the ends of the pin and accommodate stack tolerance. In an embodiment, the spring 427 is a conductive material. In other embodiments, the spring 427 is insulating, such as plastic. Additionally, while illustrated as being a discrete component, the spring 427 may be incorporated into the pin itself.

Figure 5:
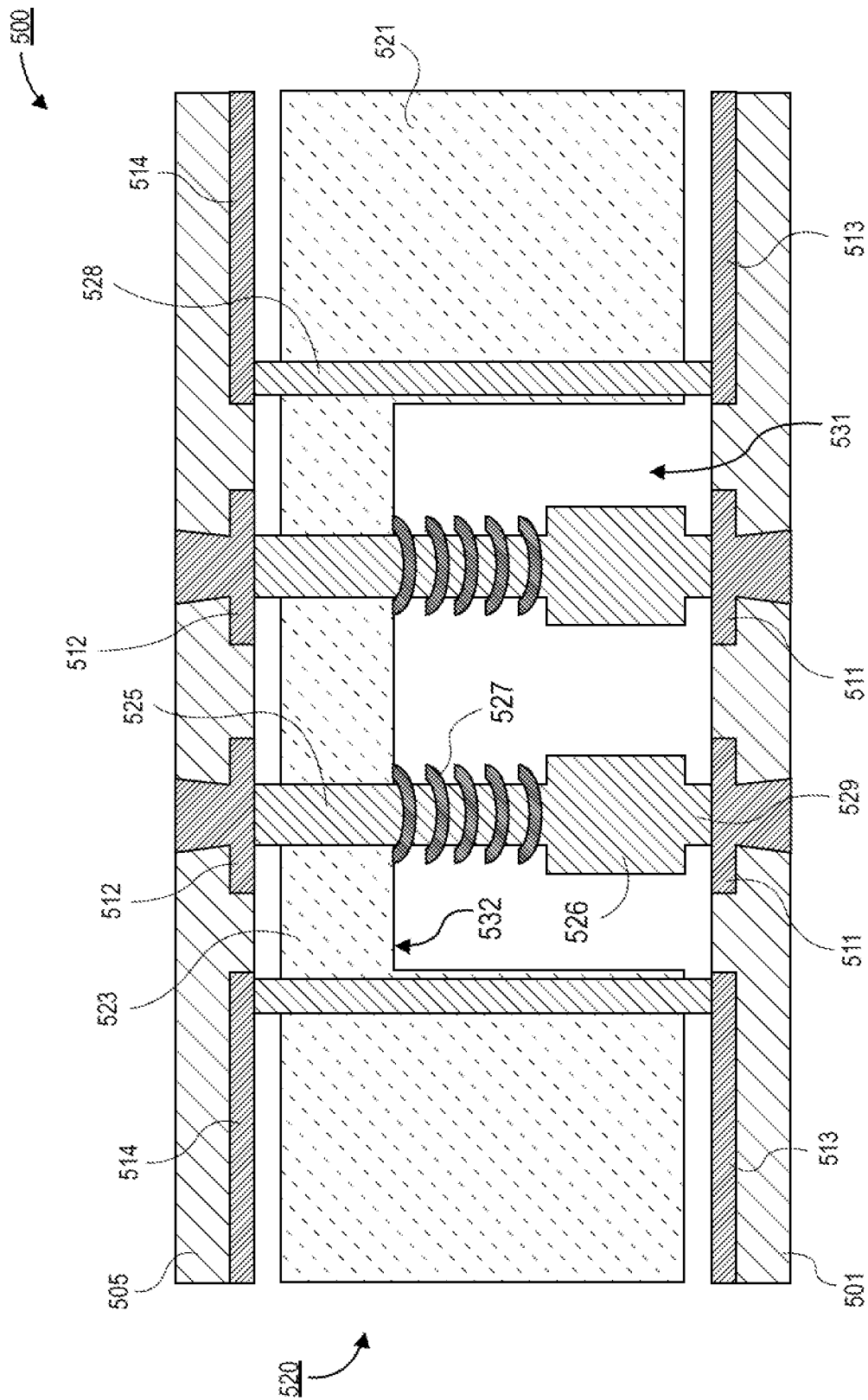
FIG. 5 is a cross-sectional illustration of an electronic package with a socket with a twinaxial architecture, where two socket pins are provided within a single conductive shell, in accordance with an embodiment.

Referring now to FIG. 5, an electronic package 500 that utilizes a socket 520 with a twinaxial design is shown, in accordance with an embodiment. The socket 520 in FIG. 5 may be similar to the socket 420 in FIG. 4, except that a pair of pins are provided within the conductive shell 528 for differential signaling applications.

In an embodiment, the electronic package 500 comprises a board 501, such as a PCB. The electronic package 500 further comprises a package substrate 505. The package substrate 505 is coupled to the board 501 by a socket 520. In an embodiment, the board 501 comprises first signal pads 511 and a ground plane 513. The package substrate 505 comprises second signal pads 512 and a ground plane 514.

In an embodiment, the socket 520 comprises a socket housing 521. The socket housing 521 may comprise a dielectric material, such as a plastic. In an embodiment, a through hole 531 is provided through the socket housing 521. The through hole 531 passes entirely through a thickness of the socket housing 521. In an embodiment, a conductive shell 528 is provided within the through hole 531 of the socket housing 521. The conductive shell 528 may be any conductive material, such as copper or the like. In an embodiment, the conductive shell 528 may be insert molded or stitched into the socket housing 521. In an embodiment, the conductive shell 528 passes past a top surface and a bottom surface of the socket housing 521. That is, a height of the conductive shell 528 is greater than a thickness of the socket housing 521. Providing a conductive shell 528 that extends past the top and bottom surfaces of the socket housing 521 has several benefits. One benefit is that the entire length of the signaling pins can be shielded, and cross-talk is reduced. Additionally, the conductive shell 528 can function as an ISP to act as a hard stop for the package substrate 505 and the board 501 during assembly. In an embodiment, the conductive shell 528 is grounded. Particularly, the conductive shell 528 may be electrically coupled to the ground plane 513 on the board 501 and the ground plane 514 on the package substrate 505.

In an embodiment, a plug 523 is provided within the conductive shell 528. The plug 523 may be a dielectric material that is tuned to help provide a desired impedance.

In an embodiment, the plug 523 is provided proximate to a top side of the conductive shell 528. That is, the plug 523 may be closer to the package substrate 505 than to the board 501. The plug 523 may be secured to an interior surface of the conductive shell 528. In the illustrated embodiment, a thin portion of the plug 523 extends down the interior surface of the conductive shell 528. However, it is to be appreciated that the plug 523 may also omit such extensions in some embodiments. In an embodiment, the plug 523 may comprise a bottom surface 532. The bottom surface 532 serves as a stop for a spring 527.

In an embodiment, a pair of conductive pins pass through an interior of the conductive shell 528. The pins may each comprise a plurality of portions of varying diameters. In an embodiment, first portions 525 have a first diameter and second portions 526 have a second diameter. The second diameter may be larger than the first diameter. In an embodiment, the larger second diameter may provide a stop for the spring 527. That is, the spring 527 may be secured between the plug 523 and the second portion 526 of the pin. In an embodiment, the pins may further comprise third portions 529. The third portion 529 of each pin may be positioned between the second portion 526 and the board 501. The third portion 529 of each pin may contact one of the first pads 511. In an embodiment, the first portion 525 of each pin may contact one of the second pads 512 on the package substrate 505.

In an embodiment, the first portions 525 of the pins may pass through the plug 523. In an embodiment, holes through the plug 523 allow for the first portions 525 of the pin to displace relative to the plug 523. That is, the plug 523 and the first portions 525 of the pins are not affixed to each other, and the first portions 525 of the pin can slide up and down within the plug 523.

In an embodiment, the spring 527 is a helical spring. The spring 527 may surround the first portion 525 of the pin. In an embodiment, the plug 523 is affixed to the conductive shell 528, and causes the spring 527 to provide a downward force on the second portion 526 of the pin. The downward force and responding spring stroke length allows for the socket 520 to provide good electrical connections at the ends of the pins and accommodate stack tolerance. In an embodiment, the spring 527 is a conductive material. In other embodiments, the spring 527 is an insulating material, such as plastic. Additionally, while illustrated as being a discrete component, the spring 527 may be incorporated into the pin itself.

Figure 6A:
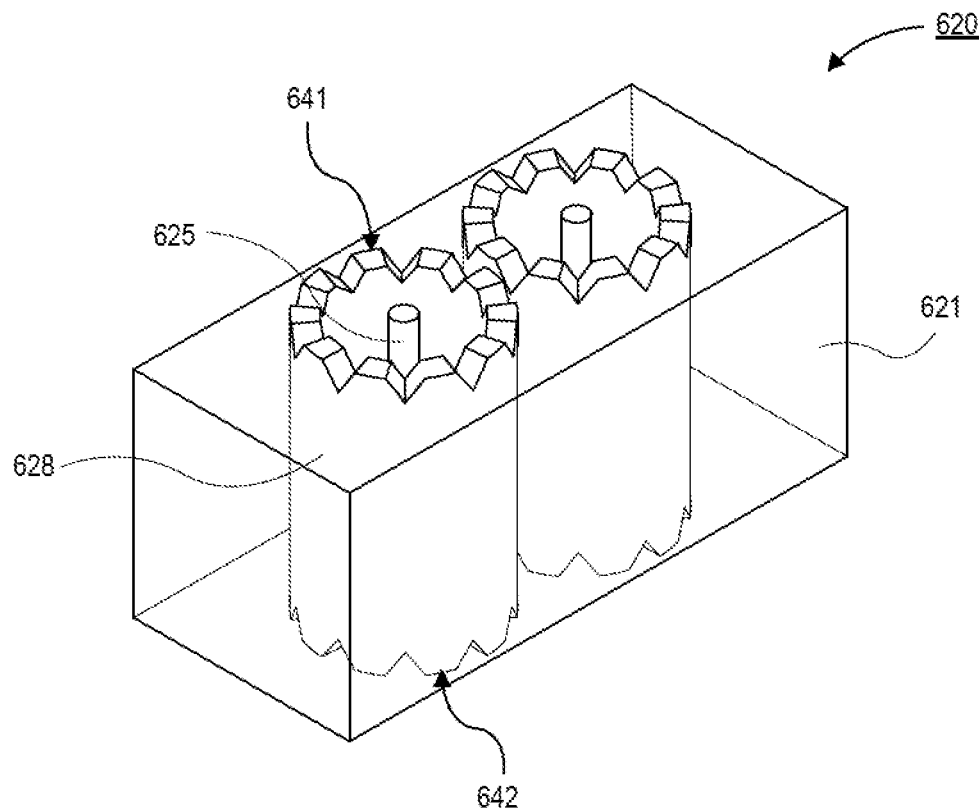
FIG. 6A is a perspective view illustration of a pair of coaxial socket pins with outer shells with crowned ends, in accordance with an embodiment.

Referring now to FIG. 6A, a perspective view illustration of a socket 620 is shown, in accordance with an embodiment. As shown, a pair of conductive shells 628 are provided in the socket housing 621. A single pin (with a first portion 625 visible) is provided within each of the conductive shells 628. The dielectric plug is omitted for clarity. In an embodiment, a top surface 641 and a bottom surface 642 of the conductive shell 628 have a crowned structure. That is, the top surface 641 and the bottom surface 642 are non-planar in some embodiments. Using crown-shaped surfaces for the conductive shell 628 provides several benefits. One benefit is that the crown-shaped surface allows for the top surface 641 and the bottom surface 642 to dig into the ground plane surface finish and form good electrical connections. Additionally, the crowned-shaped surfaces allow for more accurate modeling of electrical performance compared to a planar surface. This is because a planar surface will inherently have non-contact regions due to the inability to achieve 100% physical contact with the ground plane due to variations in surface roughness and/or other non-uniformities.

Figure 6B:
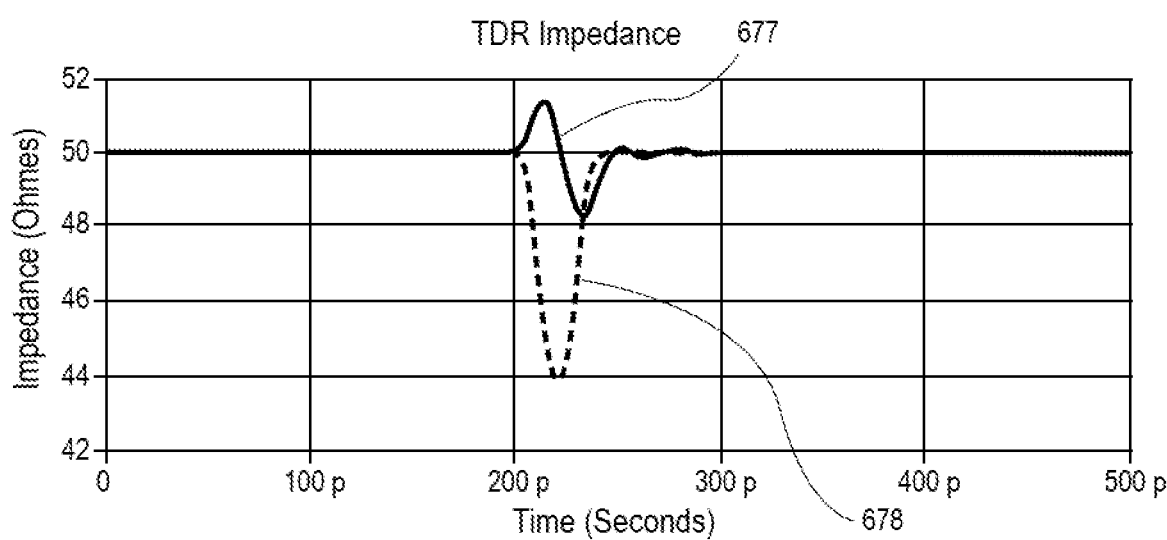
FIG. 6B is a graph of TDR impedances of coaxial socket pins compared to that of solder balls of BGA package, in accordance with an embodiment.

Referring now to FIG. 6B, a graph of time domain reflectometer (TDR) impedance of a coaxial pin compared to a BGA solder ball is shown, in accordance with an embodiment. The TDR impedance simulation assumes a cosine edge input signal with a 0-100% rise time of 30 ps. The coaxial pin may be substantially similar to the pin illustrated in the socket 620 of FIG. 6A. As shown, the coaxial pin line 677 has a significantly smaller discontinuity than the BGA package solder ball line 678. Furthermore, the pad capacitances are compensated by the inductance of the pin.

Figure 6C:
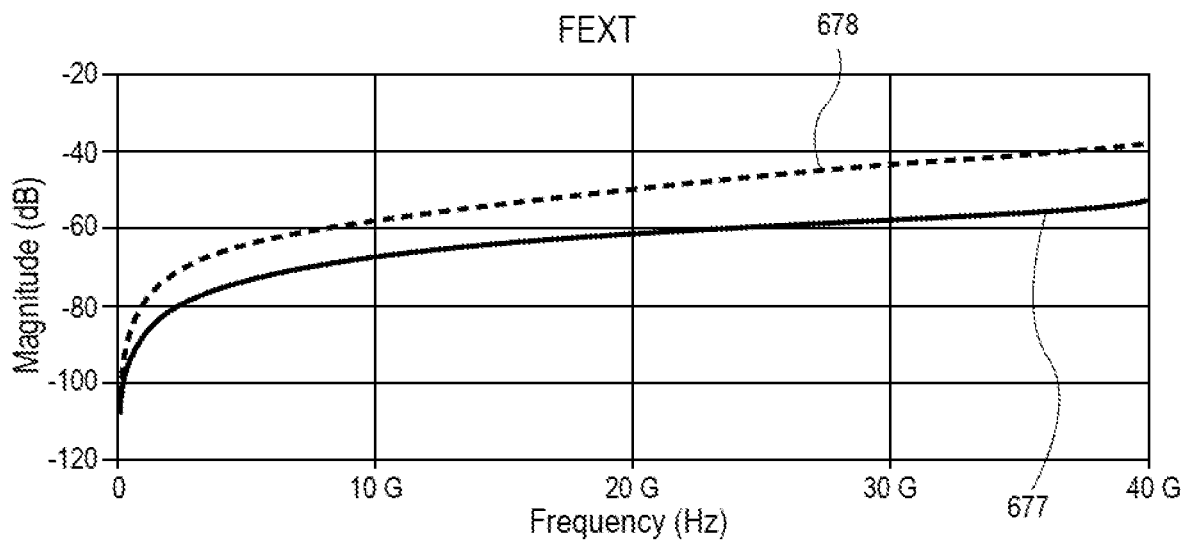
FIG. 6C is a graph of cross-talk of coaxial socket pins compared to that of solder balls of BGA package, in accordance with an embodiment.

Referring now to FIG. 6C, a graph of the far end cross-talk (FEXT) is shown, in accordance with an embodiment. As shown, the cross-talk of the coaxial pin line 677 is lower than that of the BGA solder ball line 678. The reduction in cross-talk is provided despite the pins being taller than the BGA solder ball (e.g., three times taller), and the distance between signal pins being smaller than is the case of BGA solder balls. Particularly, the reduction in cross-talk is provided as a result of the outer conductive shell 628 being grounded. The reduction in cross-talk also allows for a reduction (or elimination) of ground pins within the socket 620. As such, scaling to larger pin counts is enabled.

Figure 7A:
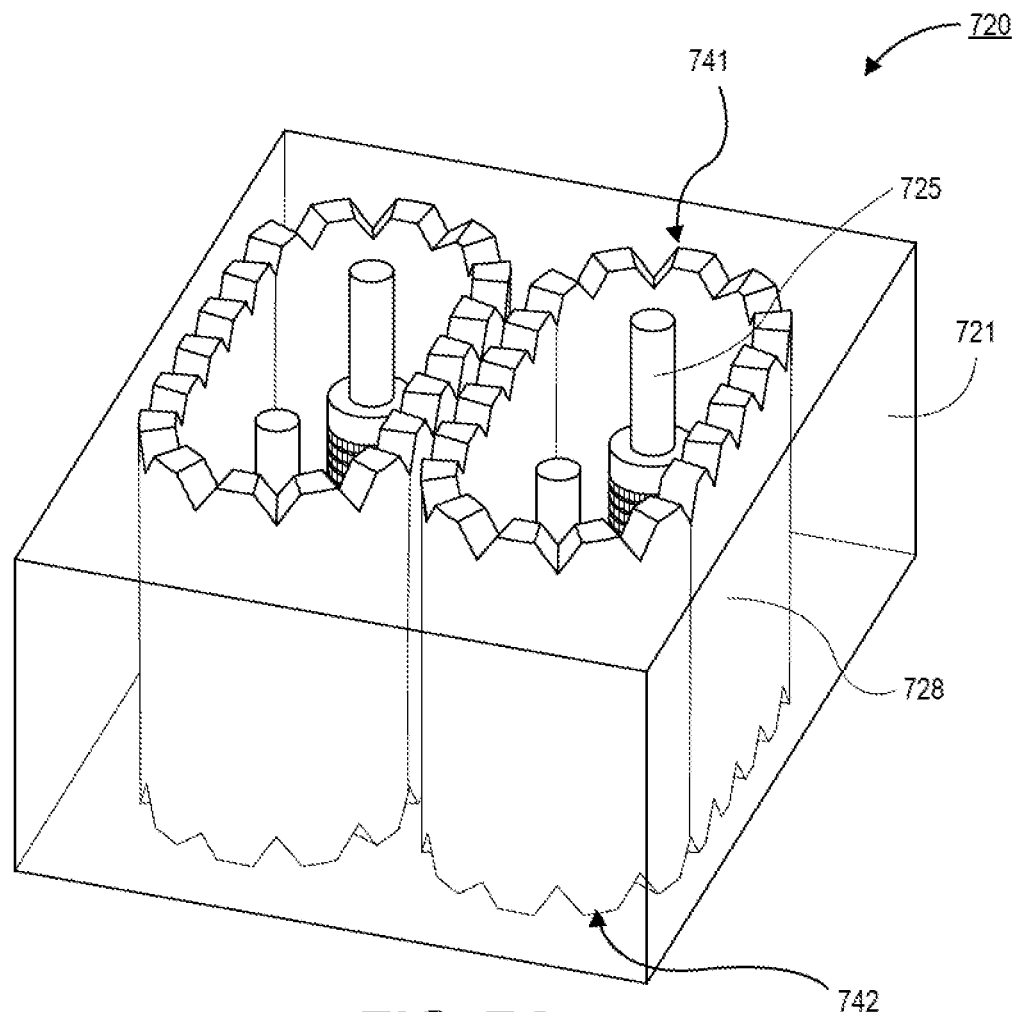
FIG. 7A is a perspective view illustration of a pair of twinaxial socket pins with outer shells with crowned ends, in accordance with an embodiment.

Referring now to FIG. 7A, a perspective view illustration of a socket 720 is shown, in accordance with an embodiment. In an embodiment, the socket 720 comprises a twinaxial transmission line pin design in a housing 721. That is, within each conductive shell 728 a pair of pins are provided. The first portions 725 of the pin are visible in FIG. 7A. In order to accommodate the two pins, the outer conductive shell 728 may be oblong shaped. Such twinaxial architectures may be used for differential signaling pairs. Similar to the embodiment described above, the outer conductive shell 728 may have crowned end surfaces 741 and 742. The crowned surfaces 741 and 742 may provide improved contact to the ground planes, as well as improving modeling accuracy.

Figure 7B:
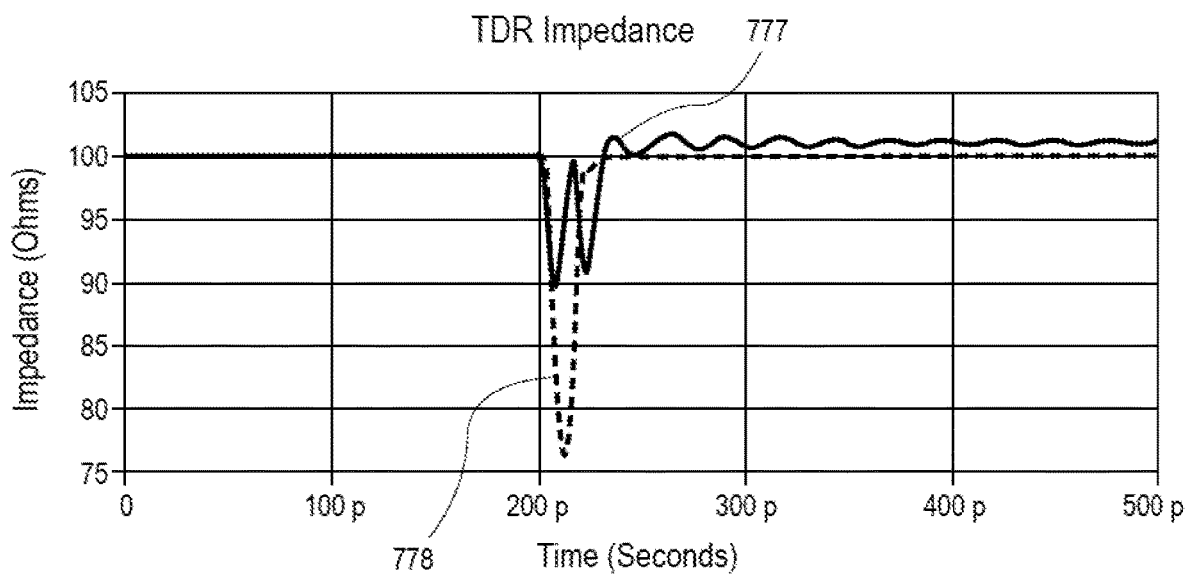
FIG. 7B is a graph of TDR impedances of twinaxial socket pins compared to that of solder balls, in accordance with an embodiment.

Referring now to FIG. 7B, a graph of TDR impedance of a twinaxial pin arrangement compared to a BGA package solder ball is shown, in accordance with an embodiment. The TDR impedance simulation assumes a step pulse with a cosine edge input signal with a 0-100% rise time of 15 ps. The modeled twinaxial pin design may be substantially similar to the pins illustrated in the socket 720 of FIG. 7A. As shown, the twinaxial pin line 777 has a significantly smaller discontinuity than the BGA solder ball line 778. For example, the BGA solder ball line may have a discontinuity of approximately 25 ohms compared to a discontinuity of approximately 10 ohms for the twinaxial pin arrangement. Furthermore, the pad capacitances are compensated by the inductance of the pin.

Figure 7C:
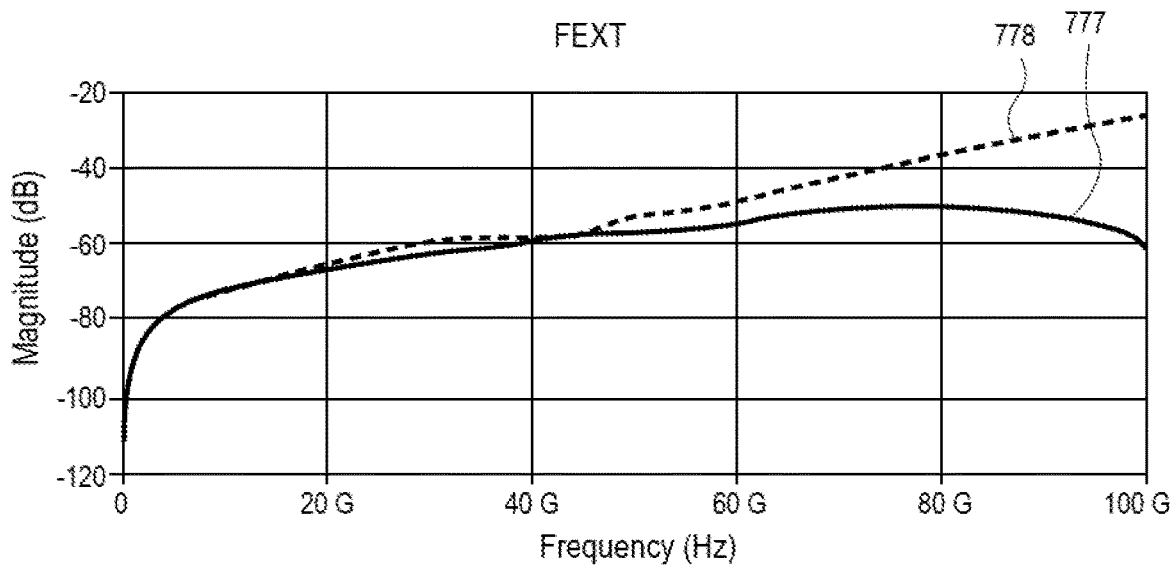
FIG. 7C is a graph of cross-talk of twinaxial socket pins compared to that of solder balls, in accordance with an embodiment.

Referring now to FIG. 7C, a graph of the FEXT is shown, in accordance with an embodiment. As shown, the cross-talk of the twinaxial pin line 777 is lower than that of the BGA solder ball line 778, especially at higher frequencies. The reduction in cross-talk is provided despite the pins being taller than the BGA solder ball (e.g., three times taller), and the distance between pairs of signal pins being smaller than is the case of BGA solder balls. Particularly, the reduction in cross-talk is provided as a result of the outer conductive shell 728 being grounded. The reduction in cross-talk also allows for a reduction (or elimination) of ground pins within the socket 720. As such, scaling to larger pin counts is enabled.

While embodiments disclosed herein may allow for the elimination of ground pins, it is to be appreciated that in some embodiments the socket architecture may include grounded pins. An example of such a grounded pin is shown in FIG. 8.

Figure 8:
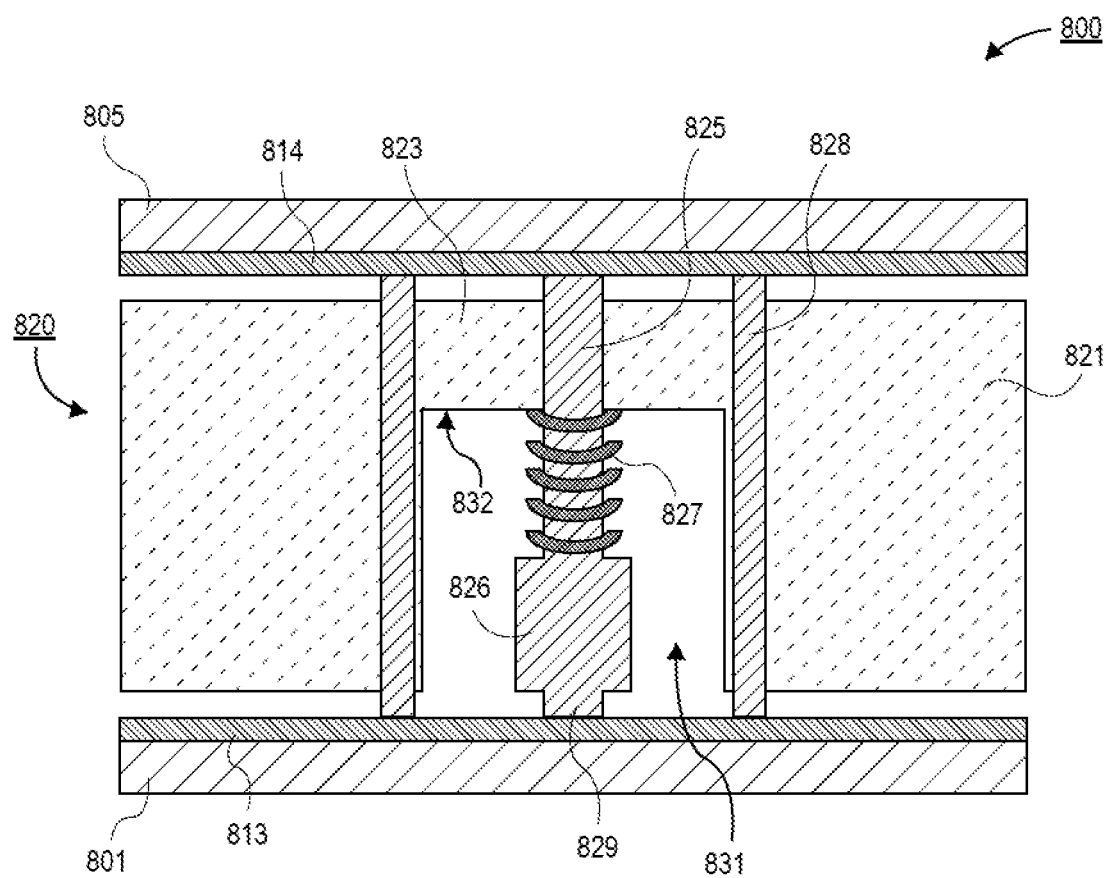
FIG. 8 is a cross-sectional of an electronic package with a coaxial socket architecture that is shorted to provide a ground pin, in accordance with an embodiment.

Referring now to FIG. 8, a cross-sectional illustration of an electronic package 800 is shown, in accordance with an embodiment. The electronic package 800 comprises a board 801 and a package substrate 805. A socket 820 electrically couples the board 801 to the package substrate 805. In an embodiment, the socket 820 comprises a socket housing 821. A through hole 831 through the socket housing 821 is lined with a conductive shell 828. A dielectric plug 823 may fill a portion of the conductive shell 828. In an embodiment, a pin passes through the through hole 831 and the plug 823. The pin may comprise a first portion 825, a second portion 826, and a third portion 829. A spring 827 may press against a bottom surface 832 of the plug 823 and the second portion 826 of the pin. In order to provide a grounded pin, the third portion 829 and the first portion 825 may contact ground planes 813 and 814 on the board 801 and the package substrate 805. The outer conductive shell 828 may also contact the ground planes 813 and 814.

Figure 9:
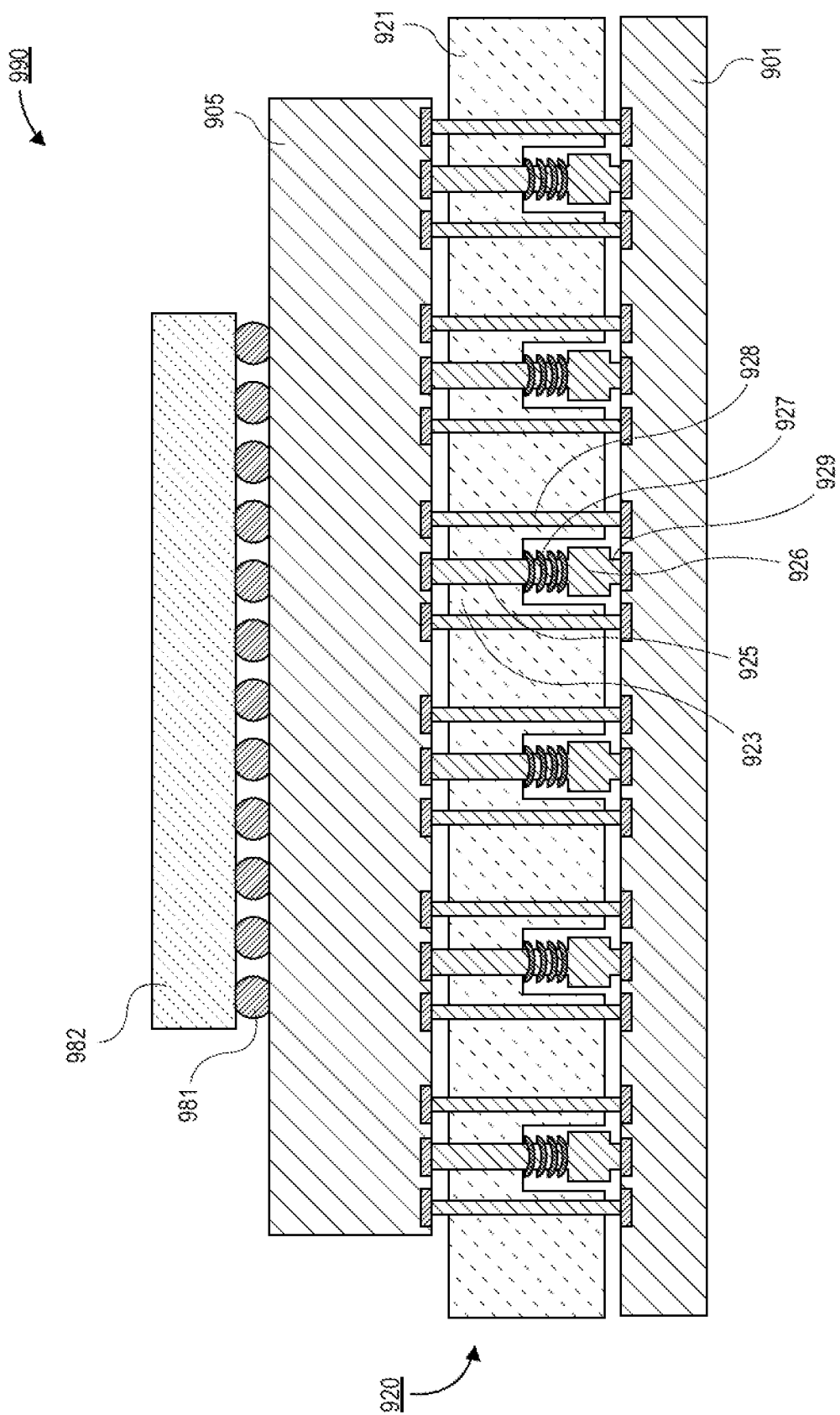
FIG. 9 is a cross-sectional illustration of an electronic system with a socket that comprises pins with a coaxial architecture, in accordance with an embodiment.

Referring now to FIG. 9, a cross-sectional illustration of an electronic system 990 is shown, in accordance with an embodiment. In an embodiment, the electronic system 990 comprises a board 901, a package substrate 905, and a die 982. In an embodiment, the package substrate 905 is coupled to the board 901 by a socket 920, and the die 982 is coupled to the package substrate 905 by first level interconnects 981.

In an embodiment, the socket 920 comprises a plurality of shielded pins within a housing 921. The shielding may be provided by a conductive shell 928. A plug 923 may seal an end of the conductive shell 928 proximate to the package substrate 905. In an embodiment, the pin may comprise a first portion 925 that passes through the plug 923 to contact a pad on the package substrate 905. The pin may further comprise a second portion 926 that is coupled to the board by a third portion 929. A spring 927 may be wrapped around the first portion 925 and secured against the plug 923 and the second portion 926 of the pin. While coaxial pin arrangements are shown, it is to be appreciated that twinaxial pin arrangements may also be included in the electronic system 990. Additionally, one or more grounded pins may also be included in the electronic system in some embodiments.

Figure 10:
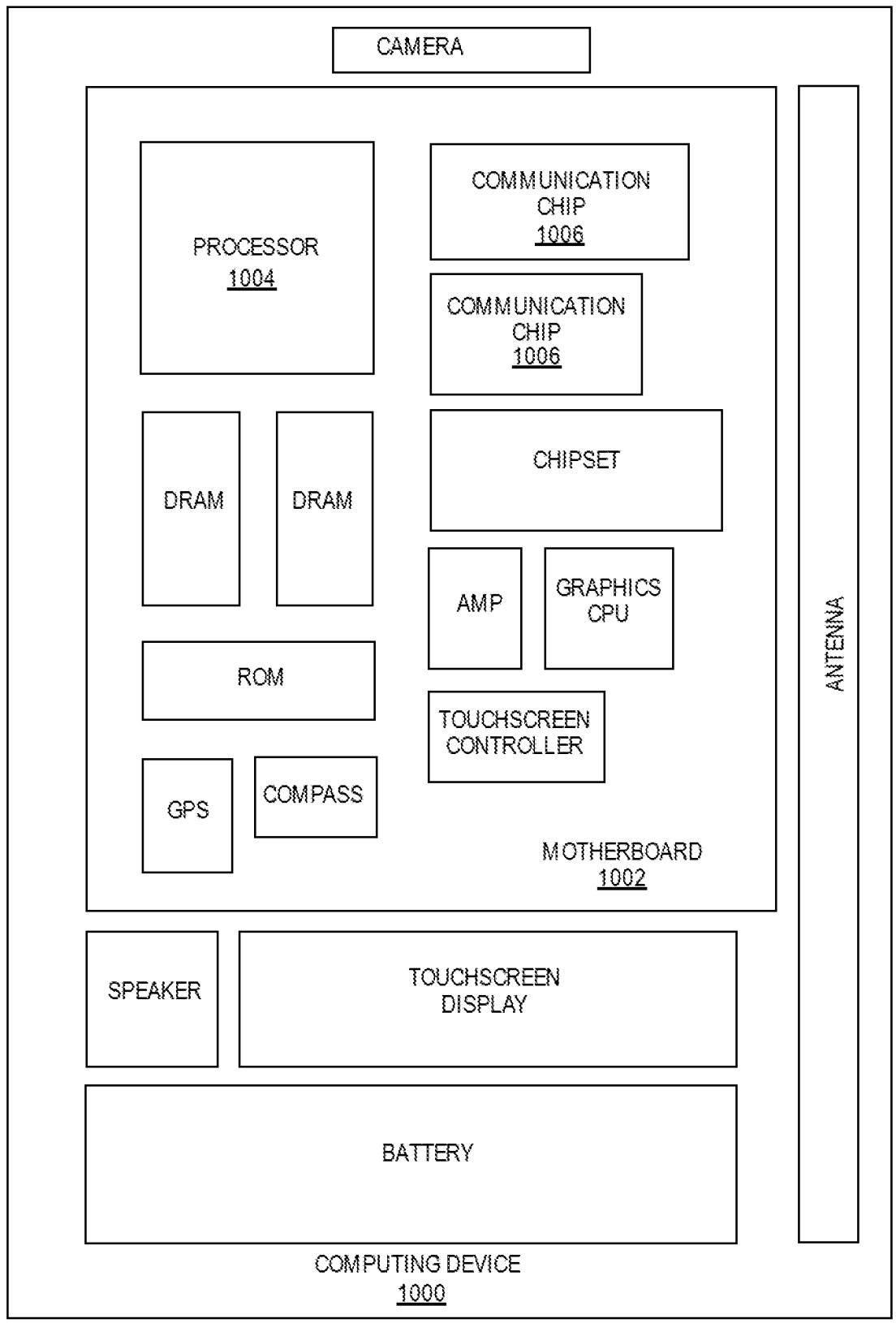
FIG. 10 is a schematic of a computing device built in accordance with an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be part of an electronic package that comprises a socket with coaxial or twinaxial pin arrangements, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be part an electronic package that comprises a socket with coaxial or twinaxial pin arrangements, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 a socket, comprising: a housing with a first surface and a second surface, wherein the housing is a dielectric material; a shell passing through a thickness of the housing between the first surface and the second surface, wherein the shell is conductive; a plug within the shell, wherein the plug is a dielectric material, and wherein the plug has a bottom surface; a pin passing through the thickness of the housing within an inner diameter of the shell, wherein the pin has a first portion with a first diameter and a second portion with a second diameter, and wherein the pin is conductive; and a spring around the first portion of the pin, wherein a first end of the spring presses against the bottom surface, and wherein a second end of the spring presses against the second portion of the pin.

Example 2 the socket of Example 1, wherein the second portion of the pin is between the bottom surface of the plug and the second surface.

Example 3 the socket of Example 1 or Example 2, wherein the first portion of the pin passes through the plug.

Example 4 the socket of Examples 1-3, wherein the shell extends past the first surface of the housing and the second surface of the housing.

Example 5 the socket of Example 4 wherein a first end of the shell and a second end of the shell are crowned surfaces.

Example 6 the socket of Examples 1-5, wherein the spring is insulating.

Example 7 the socket of Examples 1-5, wherein the spring is conductive.

Example 8 the socket of Examples 1-7, further comprising: a third portion of the pin, wherein the second portion of the pin is between the first portion of the pin and the third portion of the pin, and wherein the third portion of the pin extends past the second surface of the housing.

Example 9 the socket of Example 8, wherein the third portion of the pin has a third diameter that is smaller than the second diameter.

Example 10 the socket of Examples 1-9, further comprising: a second pin passing through the thickness of the housing within the inner diameter of the shell, wherein the second pin has a first portion with the first diameter and a second portion with the second diameter, and wherein the second pin is conductive; and a second spring around the first portion of the second pin, wherein a first end of the second spring presses against the bottom surface, and wherein a second end of the second spring presses against the second portion of the second pin.

Example 11 an electronic system comprising: a board; a socket over the board; and a package substrate over the socket, wherein the socket electrically couples the package substrate to the board, wherein the socket comprises: a housing with a first surface facing the package substrate and a second surface facing the board; a shell passing through a thickness of the housing between the first surface and the second surface, wherein the shell is conductive; a plug within the shell, wherein the plug is a dielectric material, and wherein the plug has a bottom surface; a pin passing through the thickness of the housing within an inner diameter of the shell, wherein the pin has a first portion with a first diameter and a second portion with a second diameter, and wherein the pin is conductive; and a spring around the first portion of the pin, wherein a first end of the spring presses against the bottom surface, and wherein a second end of the spring presses against the second portion of the pin.

Example 12 the electronic system of Example 11, wherein the shell is electrically coupled to a ground plane on the package substrate and the board.

Example 13 the electronic system of Example 11 or Example 12, wherein the pin provides an electrical connection between a first signal pad on the package substrate and second signal pad on the board.

Example 14 the electronic system of Examples 11-13, wherein the second portion of the pin is between the bottom surface of the plug and the second surface.

Example 15 the electronic system of Examples 11-14, wherein the first portion of the pin passes through the plug.

Example 16 the electronic system of Examples 11-15, wherein the shell extends past the first surface of the housing and the second surface of the housing.

Example 17 the electronic system of Examples 11-16, wherein the spring is insulating or conductive.

Example 18 the electronic system of Examples 11-17, further comprising: a third portion of the pin, wherein the second portion of the pin is between the first portion of the pin and the third portion of the pin, and wherein the third portion of the pin extends past the second surface of the housing.

Example 19 the electronic system of Example 18, wherein the third portion of the pin has a third diameter that is smaller than the second diameter.

Example 20 the electronic system of Examples 11-19, further comprising: a second pin passing through the thickness of the housing within the inner diameter of the shell, wherein the second pin has a first portion with the first diameter and a second portion with the second diameter, and wherein the second pin is conductive; and a second spring around the first portion of the second pin, wherein a first end of the second spring presses against the bottom surface, and wherein a second end of the second spring presses against the second portion of the second pin.

Example 21 the electronic system of Examples 11-20, wherein a first end of the shell and a second end of the shell are crowned surfaces.

Example 22 the electronic system of Examples 11-22, wherein the pin is shorted to the shell.

Example 23 the electronic system of Example 22, wherein the pin is a ground pin.

Example 24 an electronic system, comprising: a board; a package substrate coupled to the board by a socket, wherein the socket comprises: a housing; a conductive pin through the housing, wherein the conductive pin is pressed against the board by a spring; and a shell surrounding the conductive pin, wherein the shell is conductive; and a die coupled to the package substrate.

Example 25 the electronic system of Example 24, wherein the shell is electrically coupled to a ground plane on the board.

What is claimed is:
1. A socket, comprising:
  a housing with a first surface and a second surface, wherein the housing is a dielectric material;
  a shell passing through a thickness of the housing between the first surface and the second surface, wherein the shell is conductive;
  a plug within the shell, wherein the plug is a dielectric material, wherein the plug has a bottom surface and a top surface, and wherein the shell extends above the top surface of the plug;
  a pin passing through the thickness of the housing within an inner diameter of the shell, wherein the pin has a first portion with a first diameter and a second portion with a second diameter, and wherein the pin is conductive; and
  a spring around the first portion of the pin, wherein a first end of the spring presses against the bottom surface of the plug, and wherein a second end of the spring presses against the second portion of the pin.
2. The socket of claim 1, wherein the second portion of the pin is between the bottom surface of the plug and the second surface of the housing.
3. The socket of claim 1, wherein the first portion of the pin passes through the plug.
4. The socket of claim 1, wherein the shell extends past the first surface of the housing and the second surface of the housing.

5. The socket of claim 4 wherein a first end of the shell and a second end of the shell are crowned surfaces.

6. The socket of claim 1, wherein the spring is insulating.

7. The socket of claim 1, wherein the spring is conductive.

8. The socket of claim 1, further comprising:
 a third portion of the pin, wherein the second portion of the pin is between the first portion of the pin and the third portion of the pin, and wherein the third portion of the pin extends past the second surface of the housing.

9. The socket of claim 8, wherein the third portion of the pin has a third diameter that is smaller than the second diameter.

10. The socket of claim 1, further comprising:
 a second pin passing through the thickness of the housing within the inner diameter of the shell, wherein the second pin has a first portion with the first diameter and a second portion with the second diameter, and wherein the second pin is conductive; and
 a second spring around the first portion of the second pin, wherein a first end of the second spring presses against the bottom surface, and wherein a second end of the second spring presses against the second portion of the second pin.

11. An electronic system comprising:
 a board;
 a socket over the board; and
 a package substrate over the socket, wherein the socket electrically couples the package substrate to the board, wherein the socket comprises:
  a housing with a first surface facing the package substrate and a second surface facing the board;
  a shell passing through a thickness of the housing between the first surface and the second surface, wherein the shell is conductive;
  a plug within the shell, wherein the plug is a dielectric material, wherein the plug has a bottom surface and a top surface, and wherein the shell extends above the top surface of the plug;
  a pin passing through the thickness of the housing within an inner diameter of the shell, wherein the pin has a first portion with a first diameter and a second portion with a second diameter, and wherein the pin is conductive; and
  a spring around the first portion of the pin, wherein a first end of the spring presses against the bottom surface of the plug, and wherein a second end of the spring presses against the second portion of the pin.

12. The electronic system of claim 11, wherein the shell is electrically coupled to a ground plane on the package substrate and the board.

13. The electronic system of claim 11, wherein the pin provides an electrical connection between a first signal pad on the package substrate and second signal pad on the board.

14. The electronic system of claim 11, wherein the second portion of the pin is between the bottom surface of the plug and the second surface of the housing.

15. The electronic system of claim 11, wherein the first portion of the pin passes through the plug.

16. The electronic system of claim 11, wherein the shell extends past the first surface of the housing and the second surface of the housing.

17. The electronic system of claim 11, wherein the spring is insulating or conductive.

18. The electronic system of claim 11, further comprising:
 a third portion of the pin, wherein the second portion of the pin is between the first portion of the pin and the third portion of the pin, and wherein the third portion of the pin extends past the second surface of the housing.

19. The electronic system of claim 18, wherein the third portion of the pin has a third diameter that is smaller than the second diameter.

20. The electronic system of claim 11, further comprising:
 a second pin passing through the thickness of the housing within the inner diameter of the shell, wherein the second pin has a first portion with the first diameter and a second portion with the second diameter, and wherein the second pin is conductive; and
 a second spring around the first portion of the second pin, wherein a first end of the second spring presses against the bottom surface, and wherein a second end of the second spring presses against the second portion of the second pin.

21. The electronic system of claim 11, wherein a first end of the shell and a second end of the shell are crowned surfaces.

22. The electronic system of claim 11, wherein the pin is shorted to the shell.

23. The electronic system of claim 22, wherein the pin is a ground pin.

24. An electronic system, comprising:
 a board;
 a package substrate coupled to the board by a socket, wherein the socket comprises:
  a housing;
  a conductive pin through the housing, wherein the conductive pin is pressed against the board by a spring; and
  a shell surrounding the conductive pin, wherein the shell is conductive;
  a plug within the shell, wherein the plug is a dielectric material, wherein the plug has a bottom surface and a top surface, and wherein the shell extends above the top surface of the plug;
  a spring around the conductive pin, wherein a first end of the spring presses against the bottom surface of the plug, and wherein a second end of the spring presses against the pin; and
 a die coupled to the package substrate.

25. The electronic system of claim 24, wherein the shell is electrically coupled to a ground plane on the board.

* * * * *